United States Patent
Liu et al.

(10) Patent No.: US 11,736,069 B2
(45) Date of Patent: Aug. 22, 2023

(54) ULTRA-HIGH BANDWIDTH INDUCTORLESS AMPLIFIER

(71) Applicant: QUALCOMM Incorporated, San Diego, CA (US)

(72) Inventors: Hao Liu, San Diego, CA (US); Li Sun, Irvine, CA (US); Dong Ren, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 175 days.

(21) Appl. No.: 17/173,947

(22) Filed: Feb. 11, 2021

(65) Prior Publication Data

US 2022/0255509 A1    Aug. 11, 2022

(51) Int. Cl.
*H03F 3/45* (2006.01)
*H03F 1/34* (2006.01)
*H03F 1/26* (2006.01)

(52) U.S. Cl.
CPC .............. *H03F 1/342* (2013.01); *H03F 1/26* (2013.01); *H03F 3/45475* (2013.01);
(Continued)

(58) Field of Classification Search
CPC ........ H03F 1/342; H03F 1/26; H03F 3/45475; H03F 3/45179; H03F 2200/372; H03F 2200/447; H03F 2203/45336; H03F 2203/45652; H03F 1/086; H03F 1/14; H03F 1/42; H03F 2203/45288; H03F 2203/45488; H03F 2203/45528; H03F 3/45197; H03F 1/3211; H03F 3/45071; H03F 1/34; H03F 3/45183; H03F 3/45479; H03F 3/45659;
(Continued)

(56) References Cited

U.S. PATENT DOCUMENTS 6,538,507 B2 * 3/2003 Prentice ............... H03G 3/3042
330/85
7,782,142 B2 * 8/2010 Lin ..................... H03F 3/45183
330/301

(Continued)

OTHER PUBLICATIONS

Balan, V., et al., "A 15-22 Gbps Serial Link in 28 nm CMOS With Direct DFE", IEEE Journal of Solid-State Circuits, IEEE, USA, vol. 49, No. 12, Nov. 20, 2014 (Nov. 20, 2014), XP011564894, pp. 3104-3115, ISSN: 0018-9200, DOI: 10.1109/JSSC.2014.2349992 [retrieved on Nov. 20, 2014] p. 3104, Left-Hand Column, Line 21—p. 3114, Left-Hand Column, Line 38, Figures 1-10.

(Continued)

*Primary Examiner* — Khanh V Nguyen
(74) *Attorney, Agent, or Firm* — Loza & Loza, LLP

(57) ABSTRACT

An amplifier has a first amplifying circuit configured to receive a voltage input and to output an amplified current, a second amplifying circuit configured to receive the amplified current and to output an amplified voltage, the second amplifying circuit comprising a pair of feedback resistive elements, each feedback resistive element being coupled to a gate and drain of a corresponding transistor in a pair of output transistors in the second amplifying circuit, and a feedback circuit configured to provide a negative feedback loop between an input and an output of the pair of output transistors, the feedback circuit including a first transconductance amplification circuit and a first equalizing circuit.

29 Claims, 10 Drawing Sheets

(52) U.S. Cl.
CPC ...... *H03F 3/45071* (2013.01); *H03F 3/45179* (2013.01); *H03F 2200/372* (2013.01)

(58) Field of Classification Search
CPC ........ H03G 5/165; H03G 5/28; H03G 1/0029; H04L 25/0272; H04L 25/03885
USPC ........ 330/258, 259, 260, 265, 266, 285, 291
See application file for complete search history.

(56) References Cited

U.S. PATENT DOCUMENTS

| | | | | |
|---|---|---|---|---|
| 8,026,761 | B2* | 9/2011 | Nolan | H03F 3/45197 |
| | | | | 330/254 |
| 8,432,222 | B2* | 4/2013 | Ivanov | H03F 3/45928 |
| | | | | 330/69 |
| 9,397,623 | B1 | 7/2016 | Lacroix | |
| 9,602,314 | B1* | 3/2017 | Chang | H04L 25/0292 |
| 10,651,803 | B2* | 5/2020 | Lee | H03F 3/4521 |
| 10,992,277 | B1* | 4/2021 | Sun | H03G 3/3036 |
| 2013/0207722 | A1 | 8/2013 | Bulzacchelli et al. | |
| 2014/0184331 | A1* | 7/2014 | Thomsen | H03F 3/45645 |
| | | | | 330/260 |

OTHER PUBLICATIONS

He, J., et al., "A 2nd-Order CTLE in 130nm SiGe BiCMOS for a 50GBaud PAM4 Optical Driver", Nov. 21, 2018 (Nov. 21, 2018), 2018 IEEE International Conference on Integrated Circuits, Technologies and Applications (ICTA), IEEE, XP033545399, pp. 151-152, [retrieved on May 3, 2019] p. 151, Left-Hand Column, Line 18—p. 152, Right-Hand Column, Line 3, Figures 1-6.

International Search Report and Written Opinion—PCT/US2022/011834—ISA/EPO—dated Apr. 29, 2022.

* cited by examiner

ULTRA-HIGH BANDWIDTH INDUCTORLESS AMPLIFIER

TECHNICAL FIELD

The present disclosure generally relates to an amplification and equalization circuit and, more particularly, to circuitry for controlling the amplification and equalization circuit under varying operating conditions.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high speed bus interface for communication of signals between hardware components. For example, the high speed bus interface may be implemented using a Peripheral Component Interconnect Express (PCIe) bus. High frequency signals being communicated using the bus interface may experience attenuation. Therefore, an amplifier and equalizer at the receiver may be used to amplify and equalize a signal received via the bus interface for processing.

SUMMARY

Certain aspects of the disclosure relate to systems, apparatus, methods and techniques for implementing and managing a high-frequency amplifier that can reliably operate at high frequencies and can operate within tightly defined tolerances under variable semiconductor process, voltage and temperature conditions.

In various aspects of the disclosure, an amplifier has a first amplifying circuit configured to receive a voltage input and to output an amplified current, a second amplifying circuit configured to receive the amplified current and to output an amplified voltage, the second amplifying circuit comprising a pair of feedback resistive elements, each feedback resistive element being coupled to a gate and drain of a corresponding transistor in a pair of output transistors in the second amplifying circuit, and a feedback circuit configured to provide a negative feedback loop between an input and an output of the pair of output transistors, the feedback circuit including a first transconductance amplification circuit and a first equalizing circuit.

In various aspects of the disclosure, an apparatus includes means for providing an amplified current by amplifying a differential voltage input, means for providing a differential voltage output by amplifying the amplified current, the means for providing the differential voltage output including a pair of feedback resistive elements and a pair of output transistors, each feedback resistive element coupled to a gate and drain of a transistor in the pair of output transistors, and means for providing a negative feedback loop between an input and an output of the pair of output transistors, the means for providing a negative feedback loop including a first transconductance amplification circuit and a first equalizing circuit.

In various aspects of the disclosure, a method for configuring an amplifier includes configuring a first amplifying circuit to receive a differential voltage input and to output an amplified current, configuring a second amplifying circuit to receive the amplified current and to output an amplified voltage, the second amplifying circuit comprising a pair of feedback resistive elements, each feedback resistive element being coupled to a gate and drain of a corresponding transistor in a pair of output transistors in the second amplifying circuit, and configuring a feedback circuit to provide a negative feedback loop between inputs and outputs of the pair of output transistors, the feedback circuit including a first transconductance amplification circuit and a first equalizing circuit.

In several aspects, the first transconductance amplification circuit includes a first transistor that has a gate coupled to a drain of a first transistor in the pair of output transistors and that has a drain coupled to a gate of a second transistor in the pair of output transistors. The first transconductance amplification circuit may include a second transistor that has a gate coupled to a drain of the second transistor in the pair of output transistors and that has a drain coupled to a gate of the first transistor in the pair of output transistors. The first transconductance amplification circuit may include a source degeneration circuit coupled between sources of the first transistor and the second transistor. The source degeneration circuit includes a source degeneration resistor collocated in an integrated circuit with the pair of feedback resistive elements. Effects of variations in process, voltage or temperature on the integrated circuit may affect the source degeneration resistor and the pair of feedback resistive elements. Changes in the amplified voltage caused by effects of the variations in process, voltage or temperature on the pair of feedback resistive elements may be counteracted by changes in the amplified voltage caused by effects of the variations in process, voltage or temperature on the source degeneration resistor. The pair of output transistors may be collocated in the integrated circuit with the first transconductance amplification circuit. Changes in transconductance gain of the pair of output transistors caused by variations in process, voltage or temperature on the integrated circuit may be counteracted by changes in transconductance gain of the first transconductance amplification circuit caused by the variations in process, voltage or temperature. The product of transconductance gain of the pair of output transistors and resistance of one of the pair of feedback resistive elements may vary less than 4 decibels for operating voltage and temperature ranges specified for the integrated circuit.

DETAILED DESCRIPTION

Figure 1:
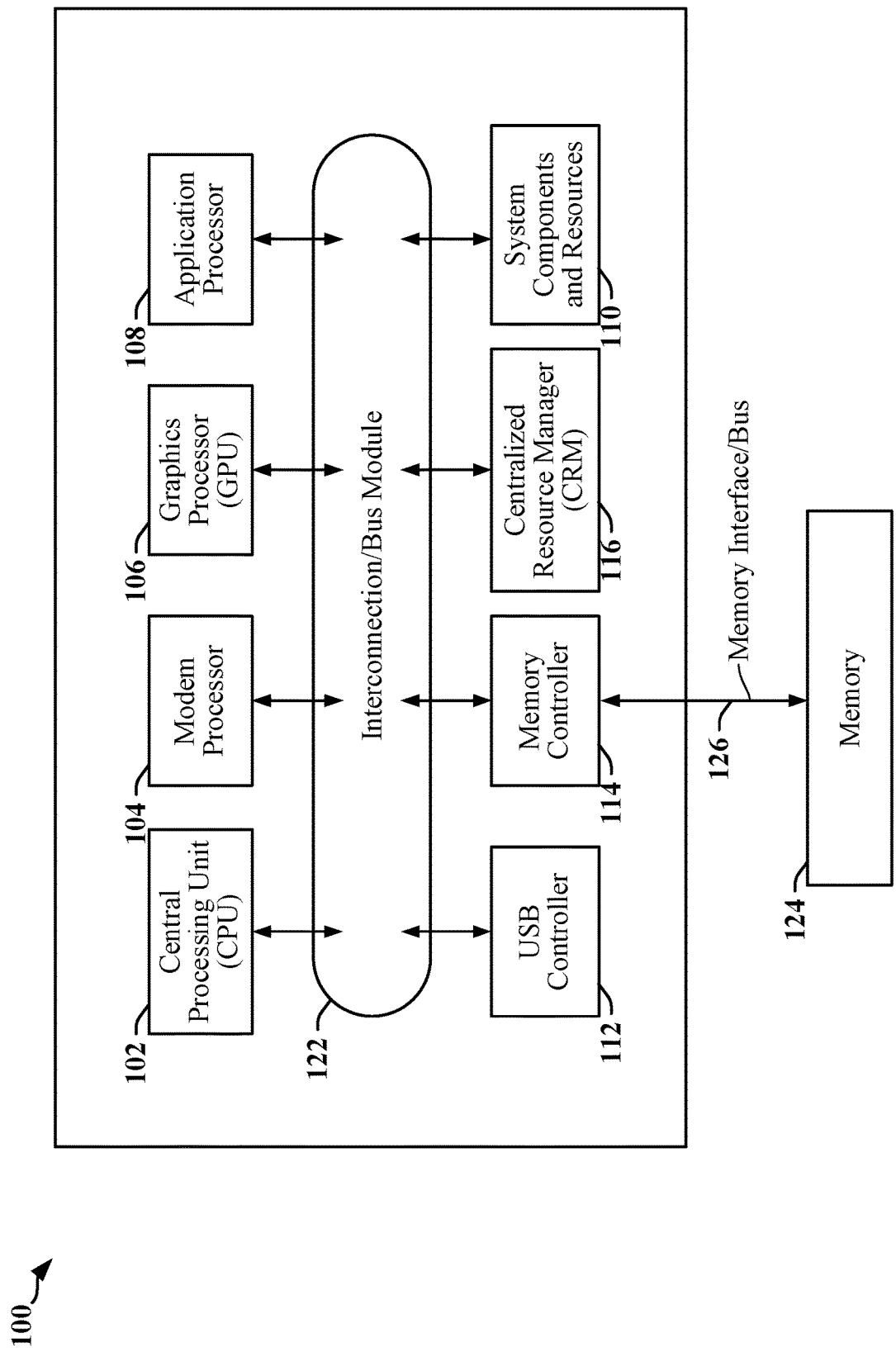
FIG. 1 illustrates an example of a system-on-a-chip (SOC) in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

FIG. 1 illustrates example components and interconnections in a system-on-chip (SoC) 100 that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
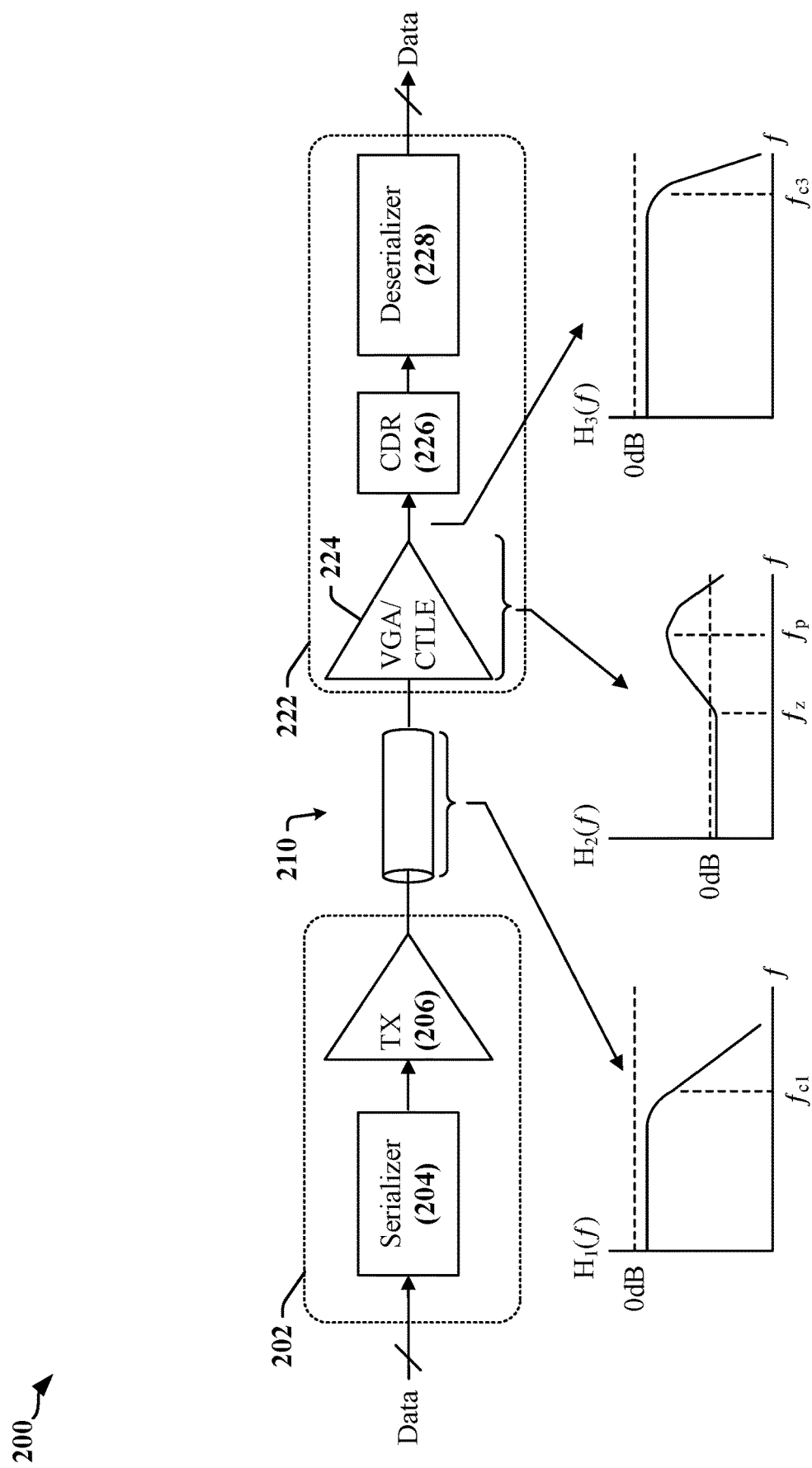
FIG. 2 illustrates an example of a data communication system that may be adapted in accordance with certain aspects of the present disclosure.

FIG. 2 illustrates an example of a data communication system 200 that may be adapted in accordance with certain aspects of the present disclosure. The data communication system 200 includes a transmitter 202, a data communication channel 210, and a receiver 222. The transmitter 202 may be provided in a first device that is configured to transmit a data signal to a second device. The data communication channel 210 provides a transmission medium through which the data signal propagates from the first device to the second device. The receiver 222 may be provided in the second device and may be configured to receive and process the data signal.

In one example, the transmitter 202 includes a serializer 204 configured to convert parallel data into serial data. The transmitter 202 further includes a transmit driver 206 configured to generate a data signal based on the serial data for transmission to the receiver 222 through the data communication channel 210.

The data communication channel 210 may be implemented using any type of transmission medium by which a data signal can propagate from the transmitter 202 to the receiver 222. Examples of the data communication channel 210 includes one or more metallization traces (which may include one or more vias) on a printed circuit board (PCB), stripline, microstrip, coaxial cable, twisted pair, etc.

The receiver 222 includes a variable gain amplifier (VGA) with a continuous time linear equalizer (CTLE) (the VGA/CTLE 224), which may be implemented in a single stage or multiple stages, a clock data recovery circuit (the CDR 226), and a deserializer 228. CTLE may refer to techniques for boosting the higher frequency components of the signal at the receiver in order to bring all frequency components of the signal to a similar amplitude, improving jitter and eye-diagram performance. As disclosed herein, the VGA/CTLE 224 is configured to perform equalization and amplification of the received data signal. The CDR 226 is configured to recover a clock associated with the data signal and use the clock to recover the serial data from the data signal. The deserializer 228 is configured to convert the serial data back into parallel data.

The data communication channel 210 typically has a frequency response $H_1(f)$ that is similar to a low pass filter. For instance, the frequency response $H_1(f)$ has relatively low losses from direct current (DC) up to a particularly cutoff frequency $f_{c1}$; then the losses increase monotonically above the cutoff frequency $f_{c1}$. The frequency response $H_1(f)$ of the data communication channel 210 limits the data rate at which data may be sent through the channel. For example, the cutoff frequency $f_{c1}$ should be at least to the Nyquist rate of the data signal. If the Nyquist rate of the data signal is above the cutoff frequency $f_{c1}$, the data signal exhibits distortion at the receiver 222, which may be characterized as the eye in a signal eye diagram closing or getting smaller, making it difficult to recover the clock and the data by the CDR 226.

The VGA/CTLE 224 may perform equalization and amplification to increase the high frequency components of the data signal in order to increase the data rate at which the data signal may be sent through the data communication cable and reliably recovered at the receiver 222. For example, the VGA/CTLE 224 may have a frequency response $H_2(f)$ that is substantially flat from DC up to a frequency $f_z$ corresponding to a zero. Then, above the zero frequency $f_z$, the frequency response $H_2(f)$ of the VGA/CTLE 224 increases up to a frequency $f_p$ corresponding to a pole. Above the pole frequency $f_p$, the frequency response $H_2(f)$ of the VGA/CTLE 224 decreases monotonically. In some examples, the VGA/CTLE 224 may have more than one pole.

The VGA/CTLE 224 may be configured to have a frequency response $H_2(f)$ where the pole frequency $f_p$ substantially coincides with the cutoff frequency $f_{c1}$ of the frequency response $H_1(f)$ of the data communication channel 210. As the data communication channel 210 is cascaded with the VGA/CTLE 224, the frequency responses $H_1(f)$ and $H_2(f)$ of the data communication channel 210 and the VGA/CTLE 224 combine at the output of the VGA/CTLE 224 to form a composite frequency response $H_3(f)$. Thus, the high frequency boost at the pole frequency $f_p$ of the VGA/CTLE frequency response $H_2(f)$ compensates for the loss roll off at the cutoff frequency $f_{c1}$ of the channel frequency response $H_1(f)$ to generate the composite frequency response $H_3(f)$ having a cutoff frequency $f_{c3}$ much higher than the cutoff frequency $f_{c1}$ of the channel frequency response $H_1(f)$. Thus, through the use of the VGA/CTLE 224, much higher data rates between the transmitter 202 and receiver 222 may be realized.

Figure 3:
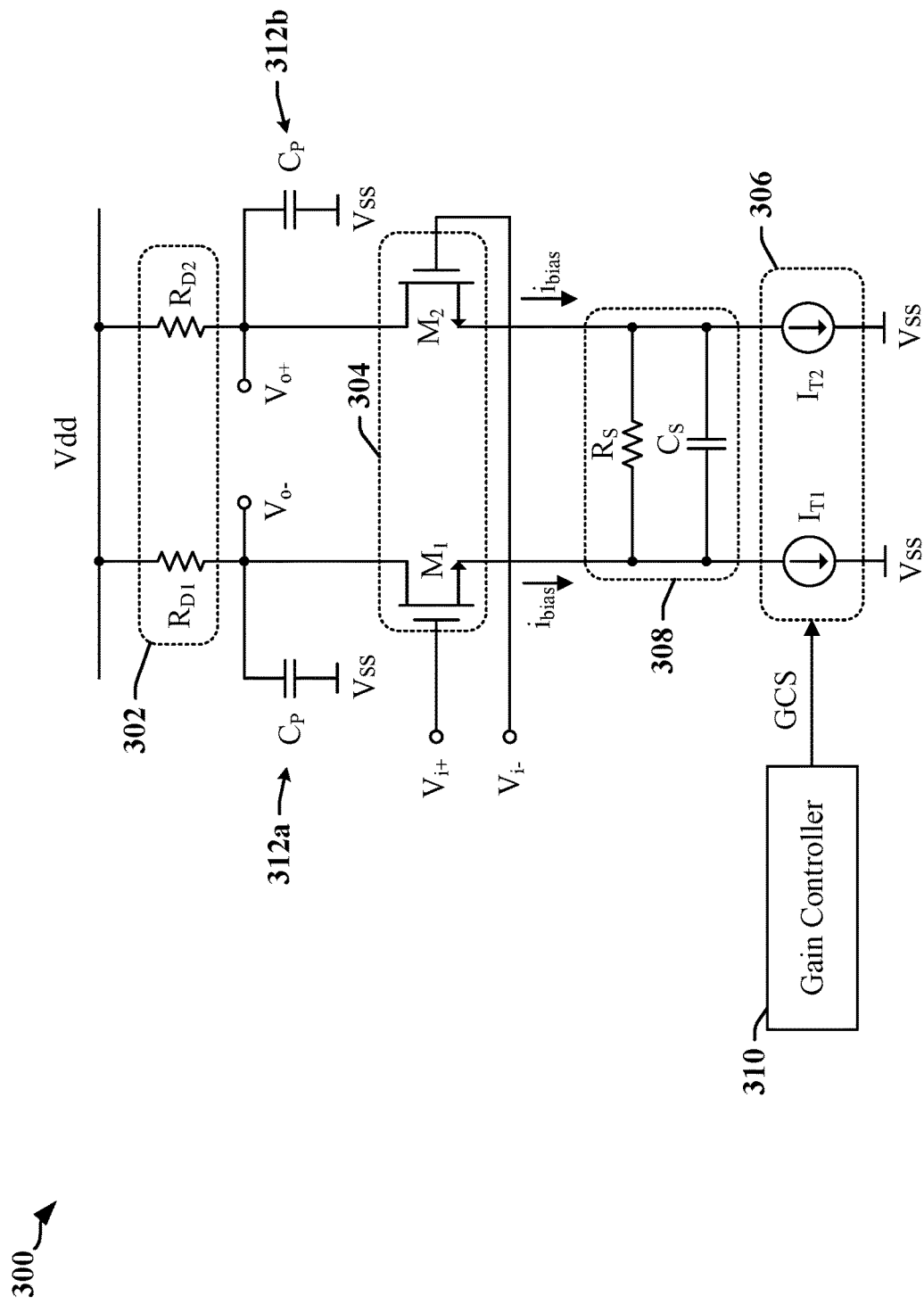
FIG. 3 illustrates a first example of an amplifier with embedded equalization, which may be adapted in accordance with certain aspects of the present disclosure.

In some examples, high-speed amplifiers are implemented using a current-mode-logic (CML) structure that operates as a transconductance amplifier (TAS). FIG. 3 illustrates an example of a variable gain amplifier (VGA) 300 with embedded equalization that may be adapted for use in accordance with certain aspects of the present disclosure. The VGA 300 may also be characterized as a CTLE with embedded gain control.

The VGA 300 includes load resistors 302, a pair of input transistors 304 (the gm pair) and corresponding tail circuits 306. A first load resistor $R_{D1}$, a first input transistor $M_1$ and a first tail current source $I_{T1}$ may be coupled in series between an upper voltage rail Vdd and a lower voltage rail Vss. A second load resistor $R_{L2}$, a second input transistor $M_2$ and a second tail current source $I_{T2}$ are coupled in series between the upper voltage rail Vdd and the lower voltage rail Vss. The load resistors 302 may be implemented as resistive devices. The pair of input transistors 304 may be formed as n-type metal-oxide-semiconductor field effect transistors (NMOS FETs). The VGA 300 further includes load capacitors $C_p$ 312a, 312b coupled between the drains of the input transistors $M_1$ and $M_2$ and the lower voltage rail Vss, respectively. The load capacitors $C_p$ 312a, 312b may represent parasitic capacitance and/or capacitive devices.

The VGA 300 further includes a source degeneration circuit 308 that provides frequency equalization. The source degeneration circuit 308 includes a source degeneration resistor $R_S$ (generally a resistive device) coupled in parallel with a source degeneration capacitor $C_S$ (generally a capacitive device) between the sources of the input transistors $M_1$ and $M_2$. The general transfer function of the VGA 300 may be stated as:

$$H(s) = \frac{g}{C_p} \times \frac{s + \frac{1}{R_S C_S}}{\left(s + \frac{1 + g_m R_S/2}{R_S C_S}\right)\left(s + \frac{1}{R_D C_p}\right)}$$

The VGA 300 may include a gain controller 310 configured to generate a gain control signal (GCS) for controlling the amount of bias current $I_{bias}$ that the tail current sources $I_{T1}$ and $I_{T2}$ sink, respectively. The gain of the VGA 300 may be directly related (in the same direction) to the bias current $I_{bias}$. Thus, the gain controller 310 can be configured to control the gain of the VGA 300 by controlling the bias current $I_{bias}$ of the tail current sources $I_{T1}$ and $I_{T2}$ via the gain control signal (GCS).

Figure 4:
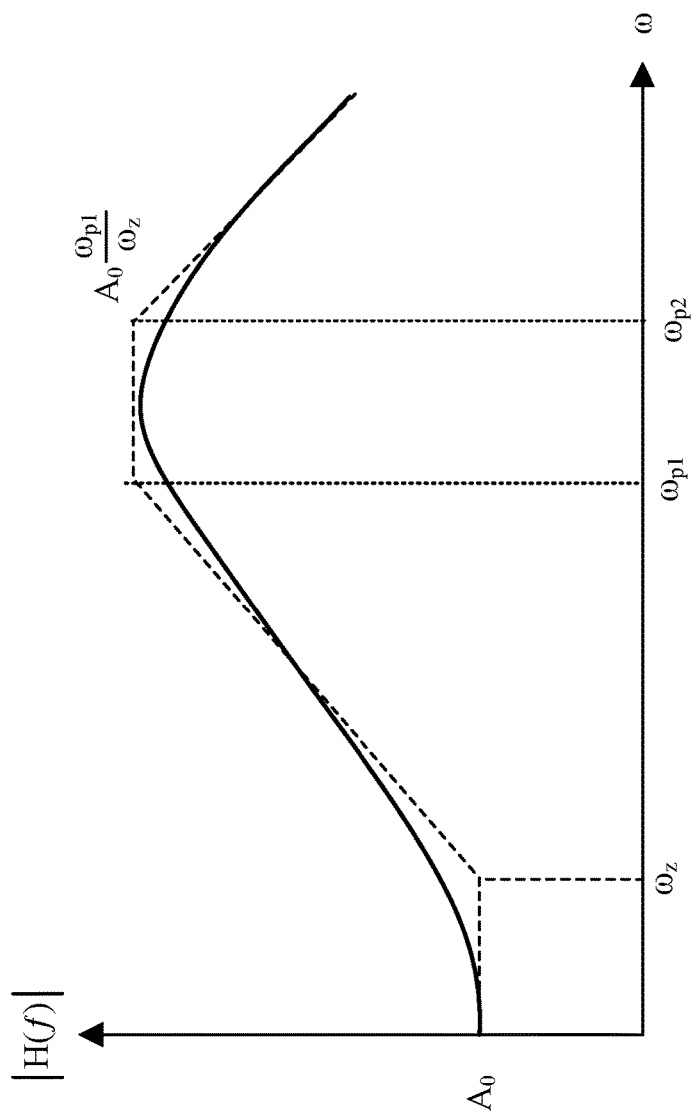
FIG. 4 illustrates an example of a frequency response of the amplifier of FIG. 3, in accordance with certain aspects of the present disclosure.

FIG. 4 illustrates an example of an alternating current (AC) gain curve 400 that illustrates certain aspects of frequency response H(f) of the VGA 300, in accordance with certain aspects of the present disclosure. The horizontal axis represents frequency (f), and the vertical axis represents gain H(f). The gain of the VGA 300 for frequencies at or below a zero frequency $f_z$ may be approximated by the following equation:

$$H(f) \cong \frac{g_m R_D}{1 + g_m \frac{R_S}{2}} \qquad \text{Eq. 1}$$

where $g_m$ is the transconductance gain of the input transistors $M_1$ and $M_2$, $R_L$ is the resistance of the load resistors $R_{L1}$ and $R_{L2}$, and $R_S$ is the resistance of the source degeneration resistor $R_S$. The zero frequency $f_z$ may be approximated by the following equation:

$$f_z = \frac{1}{2\pi R_S C_S} \qquad \text{Eq. 2}$$

where $C_S$ is the capacitance of the source degeneration capacitor $C_S$.

The gain of the VGA 300 at the pole frequency $f_p$ may be approximated by the following equation:

$$H(f) \cong g_m R_D \qquad \text{Eq. 3}$$

The pole frequency $f_p$ may be approximated by the following equation:

$$f_p = \frac{g_m}{2\pi C_s} \qquad \text{Eq. 4}$$

The transconductance gain $g_m$ of the input transistors $M_1$ and $M_2$ varies directly with the bias current $I_{bias}$ of the tail current sources $I_{T1}$ and $I_{T2}$.

With continued reference to the AC gain curve 400 of FIG. 4, as the gain controller 310 varies the gain by varying the bias current $I_{bias}$, the gain of the VGA 300 at or below the zero frequency $f_z$ varies in accordance with Eq. 1, and the gain of the VGA 300 for the frequency range between the zero frequency $f_z$ and the pole frequency $f_p$ varies more in accordance with Eq. 3. As the transconductance gain gm of the VGA 300 is in both the numerator and denominator in Eq. 1, and only in the numerator (or proportional) in Eq. 3, the gain varies less for frequencies below the zero frequency $f_z$ as compared to the gain above the zero frequency $f_z$ with changes in $I_{bias}$. This produces a non-uniform gain variation with frequency, which may be undesirable.

Moreover, as the pole frequency $f_p$ varies directly with the transconductance gain $g_m$ in accordance with Eq. 4, the pole frequency $f_p$ also varies with gain adjustments via the control of the $I_{bias}$. For example, the pole frequency $f_{p1}$ associated with the minimum gain is approximately $g_{m1}/C_S$, where $g_{m1}$ is the transconductance gain of the input transistors $M_1$ and $M_2$ when the minimum $I_{bias}$ is set. The pole frequency $f_{p2}$ associated with the maximum gain is approximately $g_{m2}/C_S$, where $g_{m2}$ is the transconductance gain of the input transistors $M_1$ and $M_2$ when the maximum $I_{bias}$ is set. Thus, the pole frequency $f_p$ increases with gain increase, which also adds another non-uniformity dimension to the frequency response H(f) of the VGA 300.

Certain characteristics of the VGA 300 can limit its usefulness at the ever-increasing data rates demanded or required by many applications. For example, increasing numbers of applications are demanding 32 Gigabit per second data rates, and the associated Nyquist frequency of 16 GHz requires that each receiver block is capable of operation at greater than 16 GHz. In some examples, systems require that the maximum and minimum gain difference remains within 4 dB over all PVT corners. In FIG. 4, $$\omega_z = \frac{1}{R_S C_S}, \omega_{p1} = \frac{1 + g_m R_S/2}{R_S C_S}, \omega_{p2} = \frac{1}{R_D C_p},$$

and $$\text{DC Gain} = \frac{g_m R_D}{1 + g_m R_S/2}, \text{Ideal Peak Gain} = g_m R_D.$$

In some examples, the values of $R_S$ and $R_D$ may be selected to determine the gain applied to low frequency signals and the gain applied to high frequency signals in order to perform equalization. The value of $R_S$ and $R_D$ determine the form of the AC gain curve 400. In some examples, $R_S$ and $R_D$ have similar values. For high frequency operation, a low $Z_{out}$ is provided by reducing the value of $R_D$, which results in increased current in the circuit to obtain an acceptable level of common-mode voltage on the output. Reduced values of $R_D$ affect gain, which is directly proportional to $R_D$, to the extent that a zero value for $R_D$ results in zero gain. Increased gain requires an increase in $g_m R_D$ that can be provided by increasing $g_m$ in high-frequency circuits where $R_D$ has been reduced. The increase in $g_m$ also increases current in the circuit. Furthermore, the VGA 300 may be unable to maintain design limitations under all expected manufacturing process, circuit supply voltage, and die temperature (PVT) variations and conditions (PVT corners). PVT insensitivity is obtained when the AC gain curve 400 is constant over expected or specified PVT corners.

Figure 5:
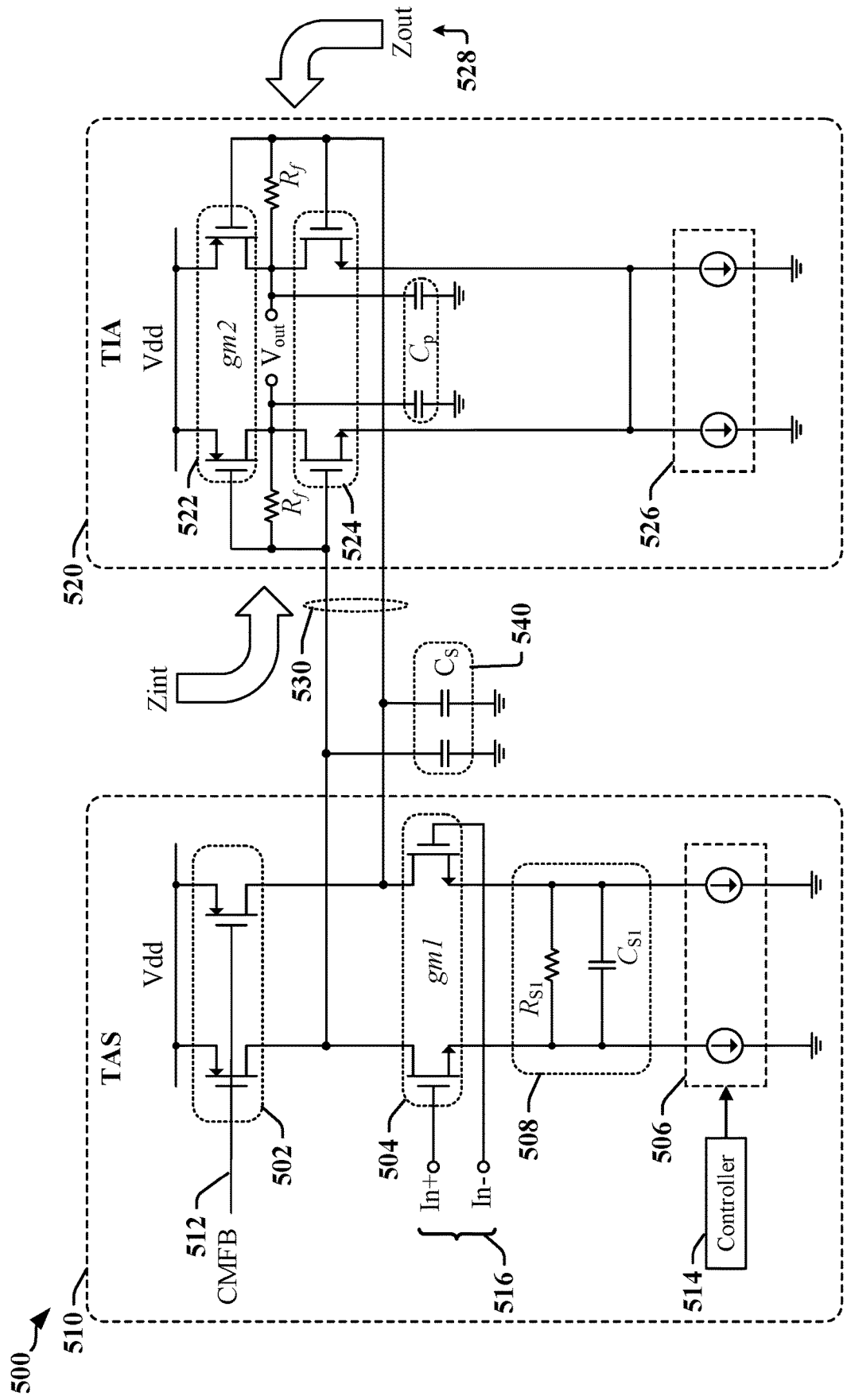
FIG. 5 illustrates a second example of an amplifier with embedded equalization, which may be adapted in accordance with certain aspects of the present disclosure.

FIG. 5 illustrates another example of an amplifier 500 with embedded equalization which may be adapted in accordance with certain aspects of the present disclosure. The amplifier 500 has a TAS section 510 and a trans-impedance amplifier section (the TIA section 520). The TAS section 510 is comparable to the VGA 300 illustrated in FIG. 3 except that the output is provided as a current by load transistors 502, whereas the load resistors 302 of the VGA 300 produce a voltage output. The TAS section 510 operates as an equalization-gain stage including an input transistor pair 504 (the gm1 transistors) with gates coupled to respective differential signals (In+, In−) that are provided as the input 516. As illustrated, a parallel RC source degeneration circuit 508 may be coupled between sources of the input transistor pair 504 for source degeneration. The source degeneration circuit 508 may enable the amplifier 500 to provide higher gains at relatively higher frequencies for CTLE. For example, the impedance of the source degeneration circuit 508 may be configured to support the operating bandwidth of a data channel of a bus interface and the source degeneration circuit 508 may be adjusted to set a peak gain of the amplifier 500 at the Nyquist frequency of the data channel.

In certain examples, current sources 506 may be configured to source or sink a tail current from the sources of respective transistors in the input transistor pair 504. A controller 514 may control the current sources 506 to adjust the gain associated with the amplifier 500. In some examples, the current sources 506 may be adjusted using a digital control signal. For example, each of the current sources 506 may represent multiple current sources that are selectively activated using bits of the digital control signal. In certain aspects, the current sources 506 may be controlled via an analog control signal.

In the illustrated example, a pair of p-type metal-oxide-semiconductor (PMOS) load transistors 502 may be coupled between the voltage rail node Vdd and respective drains of the input transistor pair 504 and may be configured to provide common-mode feedback (CMFB). For example, the gates of the load transistors 502 may be coupled to a CMFB node that provides a CMFB signal 512.

The TIA section 520 receives a current as a differential input 530 and provides a voltage output. A differential input 530 of the TIA section 520 may be coupled to the drains of the input transistor pair 504 in the TAS section 510. The TIA section 520 includes a pair of output PMOS transistors (the gm2 transistors 522) and a pair of output NMOS transistors 524. The gates of a first transistor in the gm2 transistors 522 and a first transistor in the NMOS transistors 524 are coupled to a first end of a first feedback resistive element ($R_f$) that has a second end coupled to the drain of the first transistor in the gm2 transistors 522 and to the drain of the first transistor in the NMOS transistors 524. The gates of a second transistor in the gm2 transistors 522 and a second transistor in the NMOS transistors 524 are coupled to a first end of a second feedback resistive element (RF) that has a second end coupled to the drain of the second transistor in the gm2 transistors 522 and to the drain of the second transistor in the NMOS transistors 524. The TIA section 520 may also include tail current sources 526 configured to source or sink biasing currents from the sources of the NMOS transistors 524. The feedback resistive elements may be configurable to control the gain associated with the TIA section 520. In some examples, shunt capacitive elements 540 ($C_S$) may be coupled to respective drains of the input transistor pair 504 in the TAS section 510.

The amplifier 500 illustrated in FIG. 5 addresses certain high-frequency shortcomings of the VGA 300 illustrated in FIG. 3. The gain provided by the amplifier=$g_{m1}R_f$. However, the output impedance 528 is defined as:

$$Z_{out} = \frac{1}{sC_P} // \frac{1+sC_s R_f}{g_{m2}+sC_S}.$$

Figure 6:
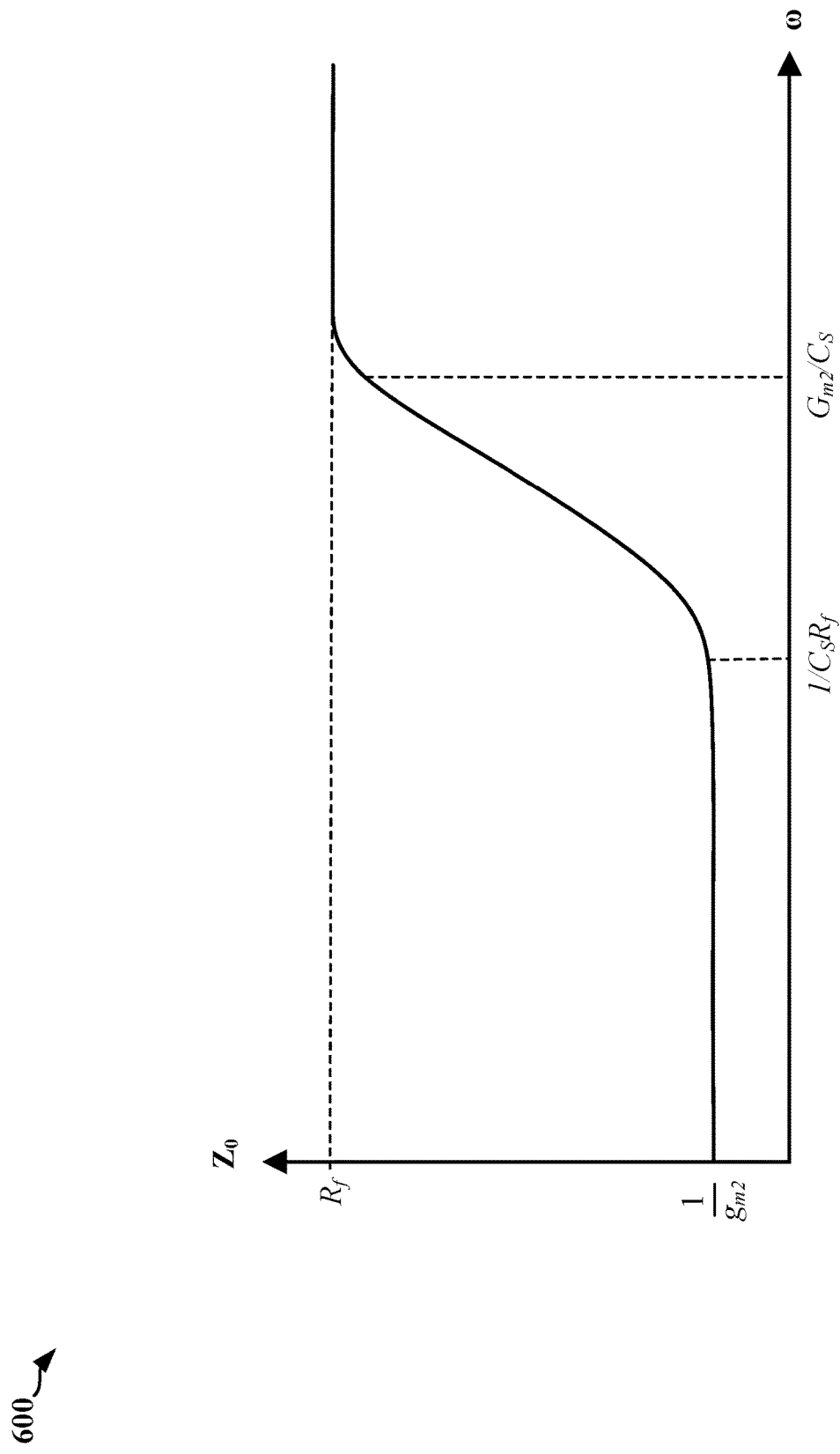
FIG. 6 illustrates the variation of output impedance of the amplifier of FIG. 5 with changing frequency.

FIG. 6 is a curve 600 that illustrates the variation of $Z_{out}$ for changing frequency. The gain for the amplifier 500 is calculated as the product of transconductance gain and feedback resistor. With respect to the VGA 300 of FIG. 3, the amplifier 500 can provide lower output impedance 528, enabling a higher $g_{m2}$ to support higher frequency operation, and can further provide higher gain through the product of $g_{m1}$ with $R_f$ ($g_{m1}R_f$). The amplifier 500 may be unable to maintain design limitations under all expected PVT variations (PVT corners).

The VGA 300 of FIG. 3 and amplifier 500 of FIG. 5 are associated with certain characteristics that can prevent operation at rates required by many applications, which are continually demanding higher data rates. Many applications require data rates approaching or exceeding 32 Gigabit per second data rates, and the associated Nyquist frequency of 16 GHz requires that each receiver block is capable of operation at greater than 16 GHz. The VGA 300 of FIG. 3 and amplifier 500 of FIG. 5 cannot reliably operate at frequencies greater than 16 GHz while maintaining maximum gain difference over all PVT corners. For example, certain systems impose a 4 dB maximum frequency gain variation over a wide variety of PVT corners. Some of these systems do not provide calibration or tuning opportunities after system initialization.

The VGA 300 can be PVT-insensitive if the $g_{m1}R_D$ term remains constant under various PVT conditions. However, both $g_{m1}$ and $R_D$ can vary with changes in temperature and operating voltage and limiting the effects of PVT variances requires that each of $g_m$ and $R_D$ are maintained as constants. The amplifier 500 can be PVT-insensitive when the $g_{m1}R_f$ term is a constant. Here again, both $g_{m1}$ and $R_f$ can vary with changes in temperature and operating voltage and limiting the effects of PVT variances requires that each of $g_m$ and $R_f$ are maintained as constants.

Certain aspects of this disclosure provide an amplifier that can tolerate wide PVT variances. In some examples, changes in transconductance gain and resistance values can be individually offset or counteracted using active feedback. In some examples, the product of resistance and transconductance gain can be maintained as a constant when changes in transconductance gain are offset or cancelled by changes in resistance values and when changes in resistance values are offset or cancelled by changes in transconductance gain.

Figure 7:
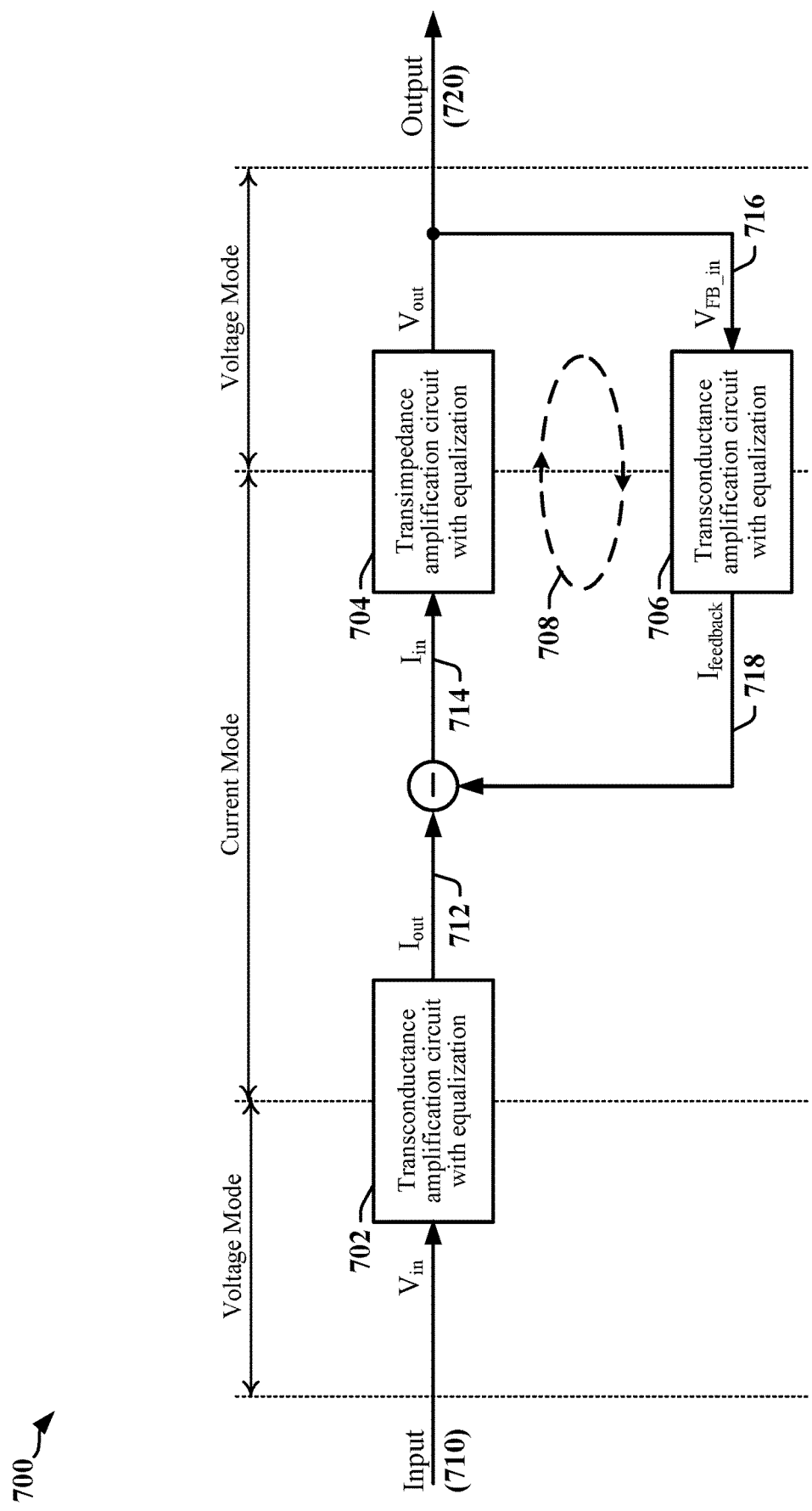
FIG. 7 illustrates certain functional elements of a voltage amplifier provided in accordance with certain aspects of this disclosure.

FIG. 7 is block diagram conceptually illustrates a voltage amplifier 700 provided in accordance with certain aspects of this disclosure. An input signal 710 is received as a differential AC voltage by a primary transconductance amplification circuit 702 that provides a current as its differential output 712. A transimpedance amplification circuit 704 receives an AC current 714 as its input and produces a differential AC voltage as its output 720. The AC current 714 received by the transimpedance amplification circuit 704 is a combination of the differential output 712 of the primary transconductance amplification circuit 702 and a differential output 718 of a feedback transconductance amplification circuit 706. The feedback transconductance amplification circuit 706 receives an AC voltage input 716 from the output 720 of the transimpedance amplification circuit 704 and provides a feedback current as the differential output 718. The feedback current is subtracted from the current provided as differential output 712 of the primary transconductance amplification circuit 702 to obtain the AC current 714 provided to the transimpedance amplification circuit 704. Feedback resistive elements and resistive elements in equalizer circuits may be subject to the same or similar PVT variances and the negative feedback loop 708 provided using the feedback transconductance amplification circuit 706 can offset the effects of PVT variances. Transconductance gain of the primary transconductance amplification circuit 702 and feedback transconductance amplification circuit 706 may be subject to the same or similar PVT variances and the negative feedback loop 708 provided using the feedback transconductance amplification circuit 706 can offset the effects of PVT variances. In some examples, the negative feedback loop 708 can operate to maintain the product of transconductance gain and resistance ($g_m R_f$) as a constant. In some instances, the effects of PVT variances on resistance can be offset, counteracted or cancelled by the effects of PVT variances on transconductance gain.

A front-end amplifier provided in accordance with certain aspects of this disclosure may be used as a first stage of a data receiver and may perform both CTLE and gain control. In the example of a Peripheral Component Interconnect Express (PCIe) bus, data channel may attenuate a signal at higher frequencies more than lower frequencies. The ability to perform CTLE and gain control within one stage of a high-speed amplifier for all required or expected PVT variations can reduce or minimize design complexity and noise contribution of multi-stage amplification systems. Uniform tunability may be difficult to implement in a single conventional amplification stage.

Certain aspects of this disclosure can satisfy the demand and ubiquitous requirements for bandwidth extension by extending operating frequency to 20 GHz or more while limiting manufacturing costs associated with modern semiconductor processes. The ability to support 20 GHz operating frequencies enables a receiving device to handle single I/O data rates in excess of single input/output (I/O).

Certain aspects disclosed herein are applicable to systems that require long-term reliability with low tolerances. For example, cloud computing and mobile servers require always-on functionality and opportunities to calibrate, train or tune an amplification stage may be limited to a process performed once at system power-on or initialization. Systems such as mobile base stations and mobile servers are expected to perform reliably for periods of time measured in months or years regardless of variations in PVT conditions. In one aspect of the disclosure, an amplifier may be provided with an active feedback path that can automatically maintain gain by counteracting changes in TIA resistance values caused by PVT variances.

Figure 8:
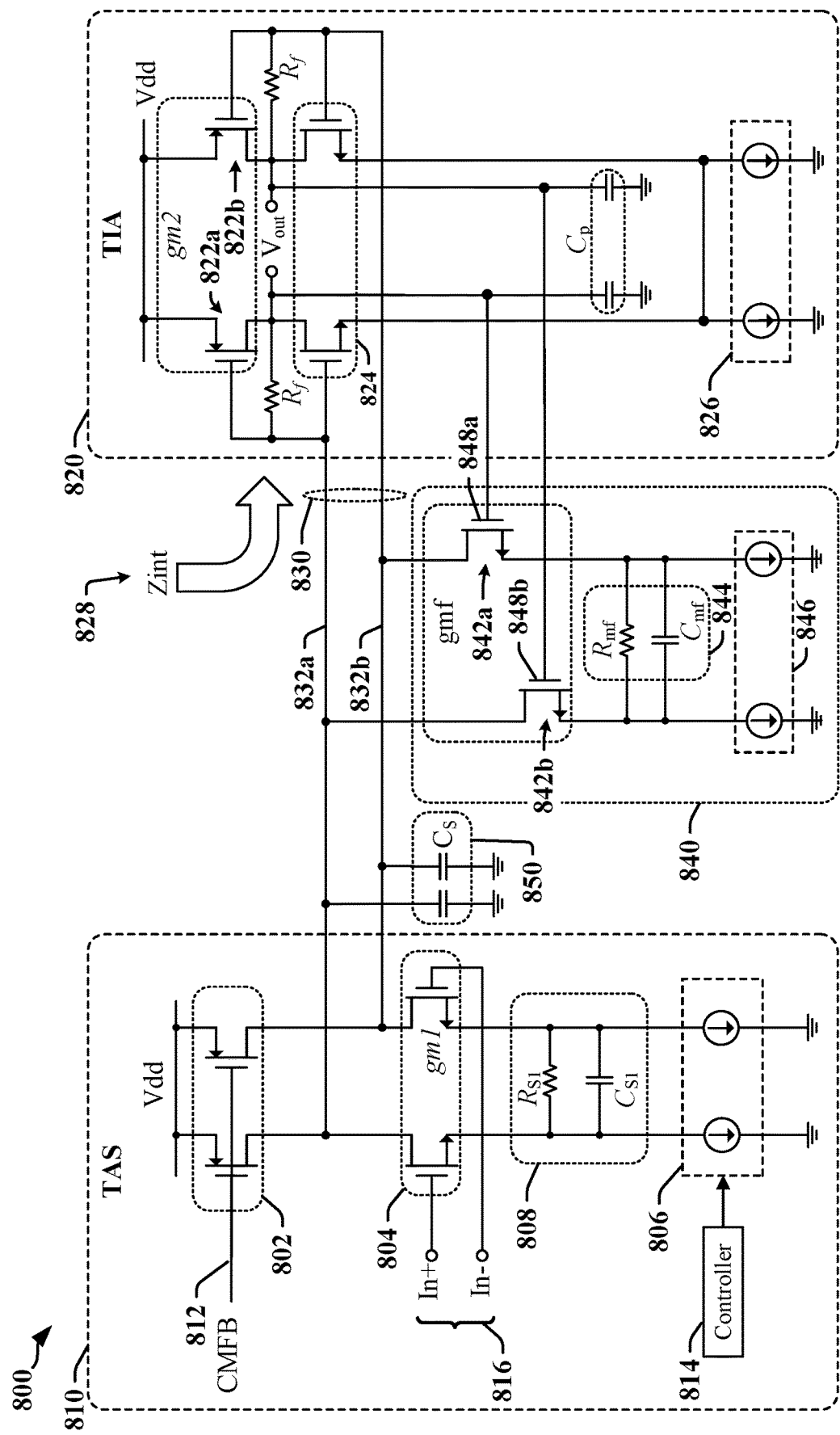
FIG. 8 illustrates an example of an amplifier with embedded equalization feedback configured in accordance with certain aspects of the present disclosure.

FIG. 8 illustrates an example of an amplifier 800 with embedded equalization feedback configured in accordance with certain aspects of the present disclosure. The amplifier 800 is a single-stage amplifier that has a transconductance amplification circuit (the TAS section 810), a transimpedance amplification circuit (the TIA section 820) and a feedback circuit 840. The TAS section 810 and TIA section 820 may be comparable to the corresponding TAS section 510 and TIA section 520 in the amplifier 500 illustrated in FIG. 5. The TAS section 810 operates as an equalization-gain circuit including an input transistor pair (the gm1 transistors 804) with gates coupled to respective differential signals (In+, In−) provided as an input 816. As illustrated, a parallel RC source degeneration circuit 808 may be coupled between sources of the gm1 transistors 804 for source degeneration. The source degeneration circuit 808 may enable the amplifier 800 to provide higher gains at relatively higher frequencies for CTLE. For example, the impedance of the source degeneration circuit 808 may be configured to support the operating bandwidth of a data channel of a bus interface. For instance, the source degeneration circuit 808 may be adjusted to set a peak gain of the amplifier 800 at the Nyquist frequency of the data channel.

In certain aspects, current sources 806 may be configured to source or sink a tail current from the sources of respective transistors in the gm1 transistors 804. A controller 814 may control the current sources 806 to adjust the gain associated with the amplifier 800. In certain aspects, the current sources 806 may be adjusted using a digital control signal. For example, each of the current sources 806 may represent multiple current sources that are selectively activated using bits of the digital control signal. In certain aspects, the current sources 806 may be controlled via an analog control signal.

In the illustrated example, a pair of PMOS transistors 802 may be coupled between the voltage rail node Vdd and respective drains of the gm1 transistors 804 and may be configured to provide common-mode feedback (CMFB). For example, the gates of the PMOS transistors 802 may be coupled to a CMFB node that provides a CMFB signal 812.

A differential input 830 of the TIA section 820 may be coupled to the drains of the gm1 transistors 804 in the TAS section 810. The TIA section 820 includes a pair of output PMOS transistors (the gm2 transistors 822a and 822b) and a pair of output NMOS transistors 824. The gates of a first gm2 transistor 822a and a first transistor in the NMOS transistors 824 are coupled to a first end of a first feedback resistive element ($R_f$) that has a second end coupled to the drain of the first gm2 transistor 822a and to the drain of the first transistor in the NMOS transistors 824. The gates of a second gm2 transistor 822b and a second transistor in the NMOS transistors 824 are coupled to a first end of a second feedback resistive element ($R_F$) that has a second end coupled to the drain of the second gm2 transistor 822b and to the drain of the second transistor in the NMOS transistors 824. The TIA section 820 may also include tail current sources 826 configured to sink biasing currents from the sources of the NMOS transistors 824. The feedback resistive elements may be configurable to control the gain associated with the TIA section 820. In some examples, shunt capacitive elements 850 ($C_S$) may be coupled to respective drains of the gm1 transistors 804 in the TAS section 810.

The feedback circuit 840 provides an active feedback path that includes a source degeneration circuit 844 ($R_{mf}/C_{mf}$). The feedback circuit 840 may be configured to at least partially cancel the effects of PVT variations in the value of $R_f$ in the TIA section 820. In the illustrated example, the feedback circuit 840 includes a pair of NMOS feedback transistors (the gmf transistors 842a, 842b) that are configured to provide negative feedback for the TIA section 820. The differential input 830 to the TIA section 820 includes a first differential input signal 832a that is coupled to the gate of the first gm2 transistor 822a and a second differential input signal 832b that is coupled to the gate of the second gm2 transistor 822b. The drain of the first gm2 transistor 822a is coupled to the gate 848a of a first gmf transistor 842a and the drain of the second gm2 transistor 822b is coupled to the gate 848b of a second gmf transistor 842b. The drain of the first gmf transistor 842a is coupled to the second differential input signal 832b and the drain of the second gmf transistor 842b is coupled to the first differential input signal 832a.

The parallel RC source degeneration circuit 844 is coupled between the sources of the gmf transistors 842a and 842b for source degeneration. The parallel RC source degeneration circuit 844 provides frequency equalization. Current sources 846 may be configured to sink a tail current from the sources of respective transistors in the gmf transistors 842a and 842b.

The illustrated feedback circuit 840 controls aspects of operation of the TIA section 820. The TIA section 820 receives a current from the TAS section 810 at its differential input 830 and through the configuration of the feedback resistors ($R_f$) provides a voltage output. The combination of the TAS section 810 and TIA section 820 together implement the amplifier 800 in which the feedback circuit 840 is integrated. The integration of the TAS section 810, the TIA section 820 and the feedback circuit 840 can improve the PVT insensitivity of the amplifier 800.

The 12,4 in the source degeneration circuit 844 provided by the feedback circuit 840 tracks $R_f$ variations. Variations in the value of $R_f$ are at least partially cancelled when constant gm biasing is used. The gmf transistors 842a and 842b in the feedback circuit 840 track the gm1 transistors 804 and variations in the gm1 transistors 804 are at least partially cancelled. The feedback circuit 840 may be operative in reducing variations in gain based on PVT variations. The feedback circuit 840 can also cancel the effects of capacitive loading on the output. The use of the feedback circuit 840 enables constant gm biasing to be used. The feedback circuit 840 controls an internal impedance 828 at the input to the TIA section 820. The internal impedance 828 may be represented as $Z_{int}$, where:

$$Z_{int} = \frac{1}{g_{m2}} // \frac{1}{sC_s} // \frac{R_f + \frac{1}{sC_p}}{\left(1 - \frac{g_{mf}}{sC_p\left(1 + g_{mf}\left(R_{mf} // \frac{1}{sC_{mf}}\right)\right)}\right)(1 - R_f g_{m2})}$$

The illustrated feedback circuit 840 can improve PVT insensitivity. In some examples, semiconductor manufacturing processes yield resistance values that can vary by 20% from nominal or designed values. In conventional amplifiers, a 20% potential variance in amplifier gain may be attributable to the resistance value variability, in addition to variations in transconductance gain. In the presently disclosed amplifier 800, gmf tracks gm1 and $R_{mf}$ tracks $R_f$ when a constant gm biasing is provided, and variations in transconductance gain can be cancelled.

Figure 9:
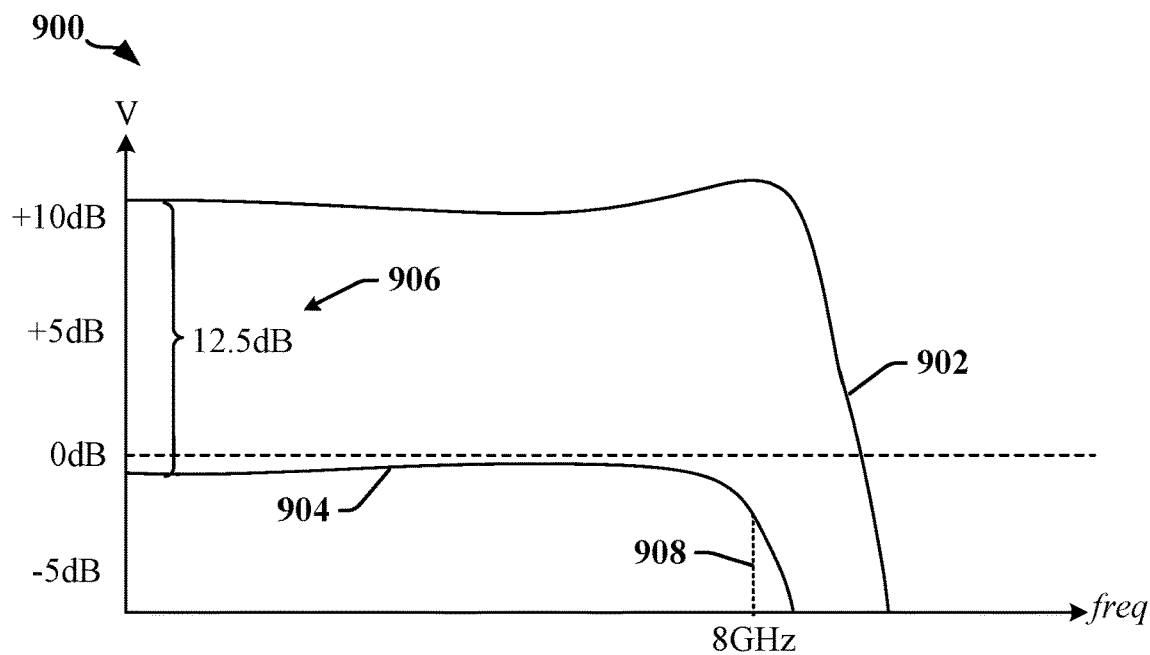
FIG. 9 provides an illustrative comparison of the frequency responses for examples of the amplifiers 500, 800 illustrated in FIGS. 5 and 8 over a range of PVT corners.
Figure 9:
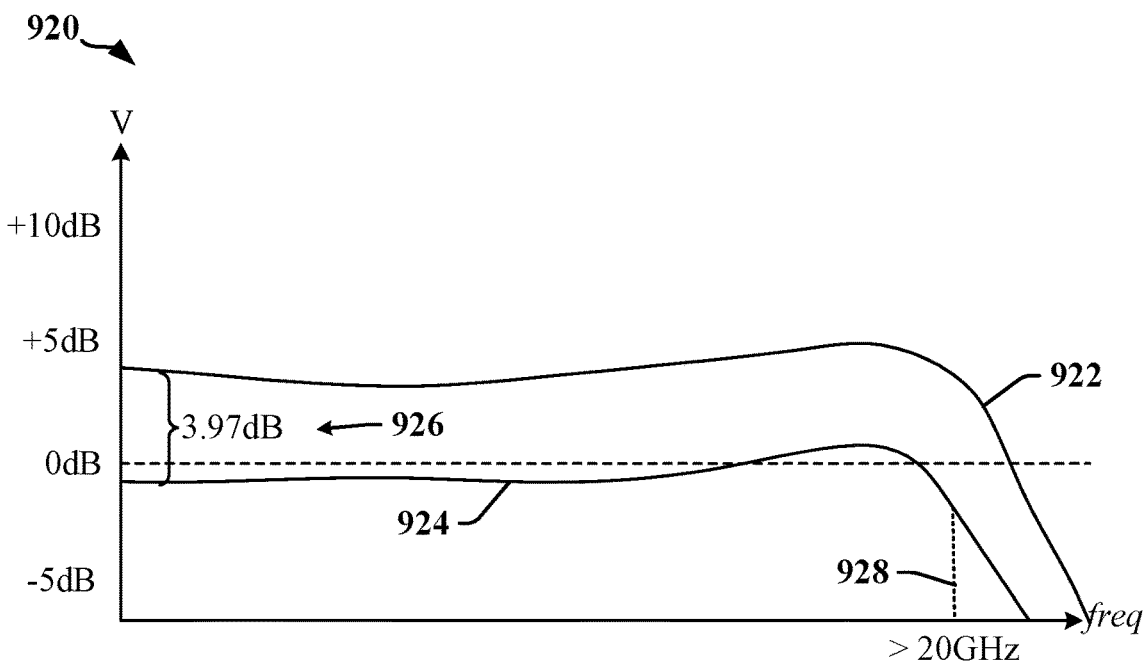

FIG. 9 provides an illustrative comparison of the frequency responses 900, 920 for examples of the amplifiers 500, 800 illustrated in FIGS. 5 and 8 over a range of PVT corners. For clarity, responses 902, 904, 922, 924 are provided for PVT corners that result in maximum and minimum voltages in each amplifier 500, 800.

The first frequency response 900 relates to the conventional amplifier 500 illustrated in FIG. 5. Here, the maximum and minimum PVT corners produce responses 902, 904 that are separated at low frequency 906 by approximately 12.5 dB and that shows the amplifier 500 to have a bandwidth of 8 GHz as determined by the worst case 1 dB drop-off point 908.

The second frequency response 920 relates to the amplifier 800 illustrated in FIG. 8 that includes an integral feedback circuit that operates to counteract TIA feedback resistor variations. Here, the maximum and minimum PVT corners produce responses 922, 924 that are separated at low frequency 926 by approximately 3.97 dB and that shows the amplifier 800 to have a bandwidth in excess of 20 GHz as determined by the worst case 1 dB drop-off point 928.

Figure 10:
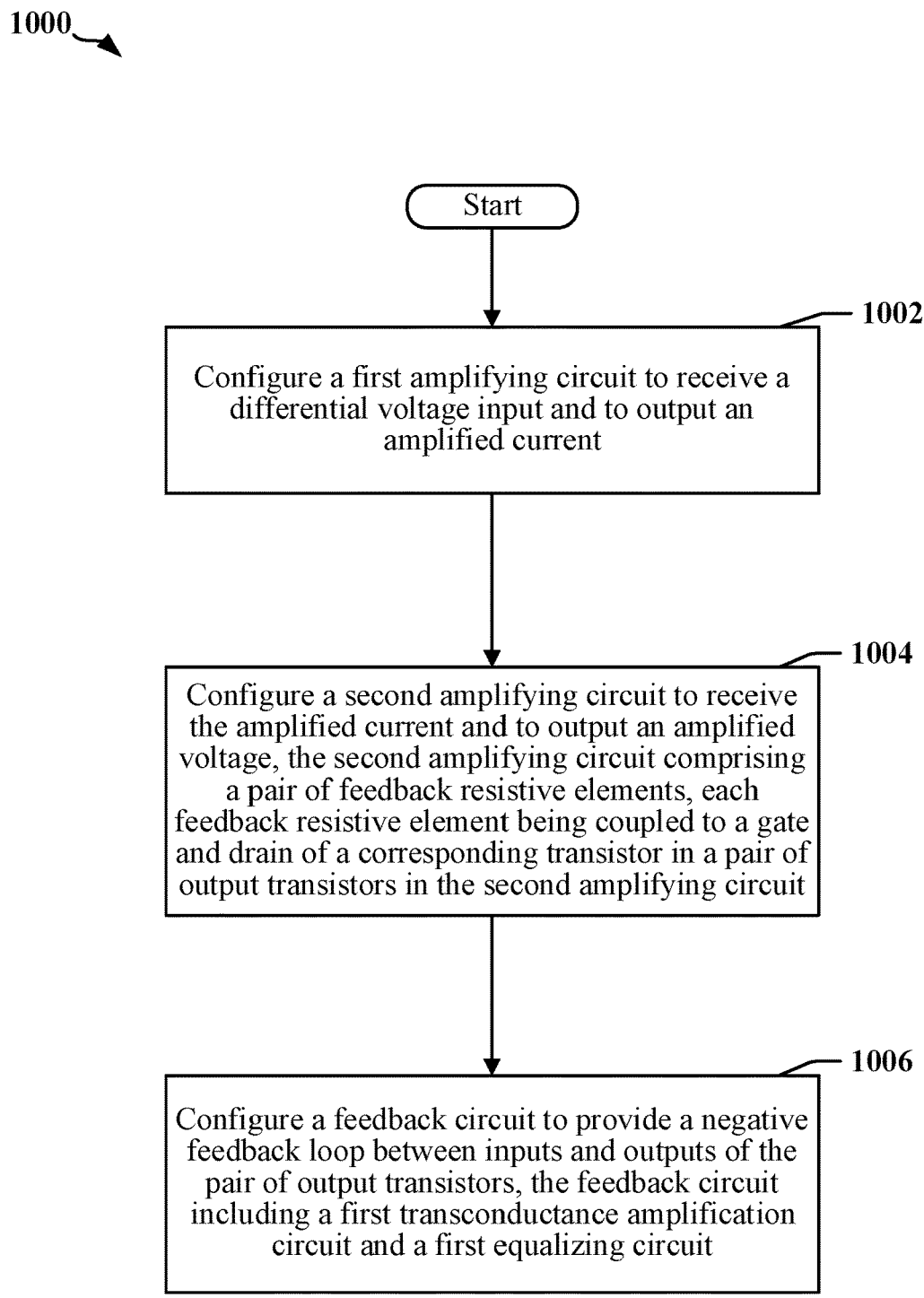
FIG. 10 is a flow diagram illustrating an example of a method for configuring a single stage amplifier in accordance with certain aspects of the present disclosure.

FIG. 10 is a flow diagram illustrating an example of a method 1000 of configuring a single stage amplifier in accordance with certain aspects of the present disclosure. The single stage amplifier may correspond to the amplifier 700 or 800 described with respect to FIGS. 7 and 8.

At block 1002, a first amplifying circuit may be configured to receive a differential voltage input and to output an amplified current. At block 1004, a second amplifying circuit may be configured to receive the amplified current and to output an amplified voltage. The second amplifying circuit may have a pair of feedback resistive elements. Each feedback resistive element may be coupled to a gate and drain of a corresponding transistor in a pair of output transistors in the second amplifying circuit. At block 1006, a feedback circuit may be configured to provide a negative feedback loop between inputs and outputs of the pair of output transistors. The feedback circuit may include a first transconductance amplification circuit and a first equalizing circuit.

In one example, the first transconductance amplification circuit includes a first transistor that has a gate coupled to a drain of a first transistor in the pair of output transistors. The drain of the first transistor may be coupled to a gate of a second transistor in the pair of output transistors. The first transconductance amplification circuit may have a second transistor that has a gate coupled to a drain of the second transistor in the pair of output transistors. The drain of the second transistor may be coupled to a gate of the first transistor in the pair of output transistors.

In some examples, the feedback circuit may be configured to cancel effects of variation in resistance of the pair of feedback resistive elements. The feedback circuit may be configured to cancel the effects of variation in transconductance gain of the first amplifying circuit.

In some examples, the feedback circuit may include a source degeneration circuit coupled between the sources of a pair of transistors in the first transconductance amplification circuit. The feedback circuit may be configured to counteract changes in resistance of the pair of feedback resistive elements based on changes of resistance value of the source degeneration circuit. The source degeneration circuit may include a source degeneration resistor collocated in an integrated circuit with the pair of feedback resistive elements. The changes in resistance of the pair of feedback resistive elements may result from variations in process, voltage or temperature on the integrated circuit.

In some examples, the pair of output transistors are included in a trans-impedance amplifier. The first amplifying circuit may include a second transconductance amplification circuit and a second equalizing circuit. The feedback circuit may be configured to cancel effects of variation in transconductance gain of the first transconductance amplification circuit. the second transconductance amplification circuit is collocated in an integrated circuit with the first transconductance amplification circuit. The changes in transconductance gain of the first transconductance amplification circuit may result from variations in process, voltage or temperature on the integrated circuit. The feedback circuit may be configured to maintain the product of transconductance gain of the second transconductance amplification circuit and a resistance value of each of the pair of feedback resistive elements within a 4 decibel range.

It is also that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. In certain aspects, means for providing an amplified current by amplifying a differential voltage input may include a transconductance amplification circuit or section such as the transconductance amplification circuit 702 or the TAS section 810, means for providing a differential voltage output by amplifying the amplified current may include a transimpedance amplification circuit such as the transimpedance amplification circuit 704 or the TIA section 820 and the means for providing a negative feedback loop may include a feedback circuit such as the feedback transconductance amplification circuit 706 or the feedback circuit 840.

In one example, an amplifier provided in accordance with certain aspects of this disclosure has first amplifying circuit, a second amplifying circuit and a feedback circuit (see FIG. 7, for example). The first amplifying circuit may be configured to receive a voltage input and to output an amplified current. The second amplifying circuit may be configured to receive the amplified current and to output an amplified voltage. The second amplifying circuit may include a pair of feedback resistive elements, each feedback resistive element being coupled to a gate and drain of a corresponding transistor in a pair of output transistors in the second amplifying circuit. The feedback circuit configured to provide a negative feedback loop between an input and an output of the pair of output transistors, the feedback circuit including a first transconductance amplification circuit and a first equalizing circuit.

In some examples, the first transconductance amplification circuit includes a first transistor that has a gate coupled to a drain of a first transistor in the pair of output transistors and that has a drain coupled to a gate of a second transistor in the pair of output transistors, and a second transistor that has a gate coupled to a drain of the second transistor in the pair of output transistors and that has a drain coupled to a gate of the first transistor in the pair of output transistors. The first transconductance amplification circuit may include a source degeneration circuit coupled between sources of the first transistor and the second transistor. The source degeneration circuit includes a source degeneration resistor collocated in an integrated circuit with the pair of feedback resistive elements. Effects of variations in process, voltage or temperature on the integrated circuit affect the source degeneration resistor and the pair of feedback resistive elements. Changes in the amplified voltage caused by effects of the variations in process, voltage or temperature on the pair of feedback resistive elements may be counteracted by changes in the amplified voltage caused by effects of the variations in process, voltage or temperature on the source degeneration resistor.

In some examples, the pair of output transistors is collocated in an integrated circuit with the first transconductance amplification circuit. Changes in transconductance gain of the pair of output transistors caused by variations in process, voltage or temperature on the integrated circuit may be counteracted by changes in transconductance gain of the first transconductance amplification circuit caused by the variations in process, voltage or temperature. In one example, the product of transconductance gain of the pair of output transistors and resistance of one of the pair of feedback resistive elements varies less than 4 decibels for operating voltage and temperature ranges specified for the integrated circuit.

Some implementation examples are described in the following numbered clauses:

1. An amplifier, comprising: a first amplifying circuit configured to receive a voltage input and to output an amplified current; a second amplifying circuit configured to receive the amplified current and to output an amplified voltage, the second amplifying circuit comprising a pair of feedback resistive elements, each feedback resistive element being coupled to a gate and drain of a corresponding transistor in a pair of output transistors in the second amplifying circuit; and a feedback circuit configured to provide a negative feedback loop between an input and an output of the pair of output transistors, the feedback circuit including a first transconductance amplification circuit and a first equalizing circuit.

2. The amplifier as described in clause 1, wherein the first transconductance amplification circuit comprises: a first transistor that has a gate coupled to a drain of a first transistor in the pair of output transistors and that has a drain coupled to a gate of a second transistor in the pair of output transistors; and a second transistor that has a gate coupled to a drain of the second transistor in the pair of output transistors and that has a drain coupled to a gate of the first transistor in the pair of output transistors.

3. The amplifier as described in clause 2, wherein the first transconductance amplification circuit comprises: a source degeneration circuit coupled between sources of the first transistor and the second transistor.

4. The amplifier as described in clause 3, wherein the source degeneration circuit includes a source degeneration resistor collocated in an integrated circuit with the pair of feedback resistive elements.

5. The amplifier as described in clause 4, wherein effects of variations in process, voltage or temperature on the integrated circuit affect the source degeneration resistor and the pair of feedback resistive elements.

6. The as described in clause 4 or clause 5, wherein changes in the amplified voltage caused by effects of the variations in process, voltage or temperature on the pair of feedback resistive elements are counteracted by changes in the amplified voltage caused by effects of the variations in process, voltage or temperature on the source degeneration resistor.

7. The amplifier as described in any of clauses 1-6, wherein the pair of output transistors is collocated in an integrated circuit with the first transconductance amplification circuit.

8. The amplifier as described in clause 7, wherein changes in transconductance gain of the pair of output transistors caused by variations in process, voltage or temperature on the integrated circuit are counteracted by changes in transconductance gain of the first transconductance amplification circuit caused by the variations in process, voltage or temperature.

9. The amplifier as described in clause 8, wherein the product of transconductance gain of the pair of output transistors and resistance of one of the pair of feedback resistive elements varies less than 4 decibels for operating voltage and temperature ranges specified for the integrated circuit.

10. An apparatus, comprising: means for providing an amplified current by amplifying a differential voltage input; means for providing a differential voltage output by amplifying the amplified current, the means for providing the differential voltage output including a pair of feedback resistive elements and a pair of output transistors, each feedback resistive element coupled to a gate and drain of a transistor in the pair of output transistors; and means for providing a negative feedback loop between an input and an output of the pair of output transistors, the means for providing a negative feedback loop including a first transconductance amplification circuit and a first equalizing circuit.

11. The apparatus as described in clause 10, wherein the first transconductance amplification circuit comprises: a first transistor that has a gate coupled to a drain of a first transistor in the pair of output transistors and that has a drain coupled to a gate of a second transistor in the pair of output transistors; and a second transistor that has a gate coupled to a drain of the second transistor in the pair of output transistors and that has a drain coupled to a gate of the first transistor in the pair of output transistors.

12. The apparatus as described in clause 11, wherein the means for providing a negative feedback loop is configured to cancel effects of variation in resistance of the pair of feedback resistive elements.

13. The apparatus as described in clause 12, wherein the means for providing the amplified current includes a first amplifying circuit, wherein the feedback circuit is further configured to cancel effects of variation in transconductance gain of the first amplifying circuit 14. The apparatus as described in any of clauses 11-13, wherein the feedback circuit comprises a source degeneration circuit coupled between the sources of a pair of transistors in the first transconductance amplification circuit.

15. The apparatus as described in clause 14, wherein the means for providing a negative feedback loop is configured such that changes in resistance of the pair of feedback resistive elements are counteracted by changes of resistance value of the source degeneration circuit.

16. The apparatus as described in any of clauses 11-15, wherein the pair of output transistors in included in a trans-impedance amplifier.

17. The apparatus as described in clause 16, wherein the means for providing the amplified current includes a second transconductance amplification circuit, and wherein the means for providing a negative feedback loop is further configured to cancel effects of variation in transconductance gain of the first transconductance amplification circuit.

18. The apparatus as described in clause 16 or clause 17, wherein the means for providing the amplified current includes a second transconductance amplification circuit, and wherein the feedback circuit is further configured to maintain the product of transconductance gain of the second transconductance amplification circuit and a resistance value of each of the pair of feedback resistive elements within a 4 decibel range.

19. A method for configuring an amplifier, comprising: configuring a first amplifying circuit to receive a differential voltage input and to output an amplified current; configuring a second amplifying circuit to receive the amplified current and to output an amplified voltage, the second amplifying circuit comprising a pair of feedback resistive elements, each feedback resistive element being coupled to a gate and drain of a corresponding transistor in a pair of output transistors in the second amplifying circuit; and configuring a feedback circuit to provide a negative feedback loop between inputs and outputs of the pair of output transistors, the feedback circuit including a first transconductance amplification circuit and a first equalizing circuit.

20. The method as described in clause 19, wherein the first transconductance amplification circuit comprises: a first transistor that has a gate coupled to a drain of a first transistor in the pair of output transistors and that has a drain coupled to a gate of a second transistor in the pair of output transistors; and a second transistor that has a gate coupled to a drain of the second transistor in the pair of output transistors and that has a drain coupled to a gate of the first transistor in the pair of output transistors.

21. The method as described in clause 19 or clause 20, further comprising:
configuring the feedback circuit to cancel effects of variation in resistance of the pair of feedback resistive elements.

22. The method as described in clause 21, further comprising: configuring the feedback circuit to cancel effects of variation in transconductance gain of the first amplifying circuit.

23. The method as described in any of clauses 19-22, wherein the feedback circuit comprises a source degeneration circuit coupled between the sources of a pair of transistors in the first transconductance amplification circuit.

24. The method as described in clause 23, further comprising: configuring the feedback circuit to counteract changes in resistance of the pair of feedback resistive elements based on changes of resistance value of the source degeneration circuit.

25. The method as described in clause 24, wherein the source degeneration circuit includes a source degeneration resistor collocated in an integrated circuit with the pair of feedback resistive elements, and wherein the changes in resistance of the pair of feedback resistive elements result from variations in process, voltage or temperature on the integrated circuit.

26. The method as described in any of clauses 19-25, wherein the pair of output transistors are included in a trans-impedance amplifier.
27. The method as described in clause 26, wherein the first amplifying circuit comprises a second transconductance amplification circuit and a second equalizing circuit, the method further comprising: configuring the feedback circuit to cancel effects of changes in transconductance gain of the first transconductance amplification circuit.
28. The method as described in clause 27, wherein the second transconductance amplification circuit is collocated in an integrated circuit with the first transconductance amplification circuit, and wherein the changes in transconductance gain of the first transconductance amplification circuit result from variations in process, voltage or temperature on the integrated circuit.
29. The method as described in any of clauses 26-28, wherein the first amplifying circuit comprises a second transconductance amplification circuit and a second equalizing circuit, further comprising: configuring the feedback circuit to maintain the product of transconductance gain of the second transconductance amplification circuit and a resistance value of each of the pair of feedback resistive elements within a 4 decibel range.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An amplifier, comprising:
   a first amplifying circuit configured to receive a voltage input and to output an amplified current;
   a second amplifying circuit configured to receive the amplified current and to output an amplified voltage, the second amplifying circuit comprising a pair of feedback resistive elements, each feedback resistive element being coupled to a gate and drain of a corresponding transistor in a pair of output transistors in the second amplifying circuit; and
   a feedback circuit configured to provide a negative feedback loop between an input and an output of the pair of output transistors, the feedback circuit including a first transconductance amplification circuit and a first source degeneration circuit.
2. The amplifier of claim 1, wherein the first transconductance amplification circuit comprises:
   a first transistor that has a gate coupled to a drain of a first transistor in the pair of output transistors and that has a drain coupled to a gate of a second transistor in the pair of output transistors; and
   a second transistor that has a gate coupled to a drain of the second transistor in the pair of output transistors and that has a drain coupled to a gate of the first transistor in the pair of output transistors.
3. The amplifier of claim 1, wherein the first amplifying circuit comprises:
   a second source degeneration circuit.
4. The amplifier of claim 1, wherein the first source degeneration circuit includes a source degeneration resistor collocated in an integrated circuit with the pair of feedback resistive elements.
5. The amplifier of claim 4, wherein effects of variations in process, voltage or temperature on the integrated circuit affect the source degeneration resistor and the pair of feedback resistive elements.
6. The amplifier of claim 5, wherein changes in the amplified voltage caused by effects of the variations in process, voltage or temperature on the pair of feedback resistive elements are counteracted by changes in the amplified voltage caused by effects of the variations in process, voltage or temperature on the source degeneration resistor.
7. The amplifier of claim 1, wherein the pair of output transistors is collocated in an integrated circuit with the first transconductance amplification circuit.
8. The amplifier of claim 7, wherein changes in transconductance gain of the pair of output transistors caused by variations in process, voltage or temperature on the integrated circuit are counteracted by changes in transconductance gain of the first transconductance amplification circuit caused by the variations in process, voltage or temperature.
9. The amplifier of claim 8, wherein a product of transconductance gain of the pair of output transistors and resistance of one of the pair of feedback resistive elements varies less than 4 decibels for operating voltage and temperature ranges specified for the integrated circuit.
10. An apparatus, comprising:
    means for providing an amplified current by amplifying a differential voltage input;
    means for providing a differential voltage output by amplifying the amplified current, the means for providing the differential voltage output including a pair of feedback resistive elements and a pair of output transistors, each feedback resistive element coupled to a gate and drain of a transistor in the pair of output transistors; and
    means for providing a negative feedback loop between an input and an output of the pair of output transistors, the means for providing a negative feedback loop including a first transconductance amplification circuit and a first source degeneration circuit.
11. The apparatus of claim 10, wherein the first transconductance amplification circuit comprises:
    a first transistor that has a gate coupled to a drain of a first transistor in the pair of output transistors and that has a drain coupled to a gate of a second transistor in the pair of output transistors; and
    a second transistor that has a gate coupled to a drain of the second transistor in the pair of output transistors and that has a drain coupled to a gate of the first transistor in the pair of output transistors.
12. The apparatus of claim 11, wherein the means for providing a negative feedback loop is configured to cancel effects of variation in resistance of the pair of feedback resistive elements.
13. The apparatus of claim 12, wherein the means for providing the amplified current includes a first amplifying circuit, wherein the means for providing a negative feedback loop is further configured to cancel effects of variation in transconductance gain of the first amplifying circuit.

14. The apparatus of claim 10, wherein the means for providing the amplified current comprises a second source degeneration circuit.

15. The apparatus of claim 10, wherein the means for providing a negative feedback loop is configured such that changes in resistance of the pair of feedback resistive elements are counteracted by changes of resistance value of the first source degeneration circuit.

16. The apparatus of claim 11, wherein the pair of output transistors in included in a trans-impedance amplifier.

17. The apparatus of claim 16, wherein the means for providing the amplified current includes a second transconductance amplification circuit, and wherein the means for providing a negative feedback loop is further configured to cancel effects of variation in transconductance gain of the first transconductance amplification circuit.

18. The apparatus of claim 16, wherein the means for providing the amplified current includes a second transconductance amplification circuit, and wherein the means for providing a negative feedback loop is further configured to maintain product of transconductance gain of the second transconductance amplification circuit and a resistance value of each of the pair of feedback resistive elements within a 4 decibel range.

19. A method for configuring an amplifier, comprising:
    configuring a first amplifying circuit to receive a differential voltage input and to output an amplified current;
    configuring a second amplifying circuit to receive the amplified current and to output an amplified voltage, the second amplifying circuit comprising a pair of feedback resistive elements, each feedback resistive element being coupled to a gate and drain of a corresponding transistor in a pair of output transistors in the second amplifying circuit; and
    configuring a feedback circuit to provide a negative feedback loop between inputs and outputs of the pair of output transistors, the feedback circuit including a first transconductance amplification circuit and a first source degeneration circuit.

20. The method of claim 19, wherein the first transconductance amplification circuit comprises:
    a first transistor that has a gate coupled to a drain of a first transistor in the pair of output transistors and that has a drain coupled to a gate of a second transistor in the pair of output transistors; and
    a second transistor that has a gate coupled to a drain of the second transistor in the pair of output transistors and that has a drain coupled to a gate of the first transistor in the pair of output transistors.

21. The method of claim 19, wherein the feedback circuit cancels effects of variation in resistance of the pair of feedback resistive elements.

22. The method of claim 21, wherein the feedback circuit cancels effects of variation in transconductance gain of the first amplifying circuit.

23. The method of claim 19, wherein first source degeneration circuit is coupled between the sources of a pair of transistors in the first transconductance amplification circuit.

24. The method of claim 19, further comprising:
    configuring the feedback circuit to counteract changes in resistance of the pair of feedback resistive elements based on changes of resistance value of the first source degeneration circuit.

25. The method of claim 24, wherein the first source degeneration circuit includes a source degeneration resistor collocated in an integrated circuit with the pair of feedback resistive elements.

26. The method of claim 19, wherein the pair of output transistors are included in a trans-impedance amplifier.

27. The method of claim 26, wherein the first amplifying circuit comprises a second transconductance amplification circuit and a second source degeneration circuit, and wherein the feedback circuit cancels effects of changes in transconductance gain of the first transconductance amplification circuit.

28. The method of claim 27, wherein the second transconductance amplification circuit is collocated in an integrated circuit with the first transconductance amplification circuit, and wherein the changes in transconductance gain of the first transconductance amplification circuit result from variations in process, voltage or temperature on the integrated circuit.

29. The method of claim 26, wherein the first amplifying circuit comprises a second transconductance amplification circuit and a second source degeneration circuit, further comprising:
    configuring the feedback circuit to maintain a product of transconductance gain of the second transconductance amplification circuit and a resistance value of each of the pair of feedback resistive elements within a 4 decibel range.

* * * * *